United States Patent
Maldonado-Garcia et al.

(10) Patent No.: US 11,800,824 B2
(45) Date of Patent: Oct. 24, 2023

(54) LOW TEMPERATURE SILICON NITRIDE/SILICON OXYNITRIDE STACK FILM WITH TUNABLE DIELECTRIC CONSTANT

(71) Applicant: Applied Materials, Inc., Santa Clara, CA (US)

(72) Inventors: Maribel Maldonado-Garcia, San Jose, CA (US); Cong Trinh, Santa Clara, CA (US); Mihaela A. Balseanu, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 308 days.

(21) Appl. No.: 17/210,657

(22) Filed: Mar. 24, 2021

(65) Prior Publication Data

US 2022/0310909 A1    Sep. 29, 2022

(51) Int. Cl.
*H10N 70/00* (2023.01)
*H10N 70/20* (2023.01)

(52) U.S. Cl.
CPC ......... *H10N 70/801* (2023.02); *H10N 70/011* (2023.02); *H10N 70/231* (2023.02)

(58) Field of Classification Search
CPC ... H10N 70/023; H10N 70/011; H10N 70/801
See application file for complete search history.

(56) References Cited

U.S. PATENT DOCUMENTS

| | | | |
|---|---|---|---|
| 9,601,693 B1 | 3/2017 | Henri et al. | |
| 9,824,881 B2 | 11/2017 | Niskanen et al. | |
| 10,128,437 B1 | 11/2018 | Fantini et al. | |
| 2003/0008501 A1* | 1/2003 | Bakli | C23C 16/56 438/653 |
| 2020/0294798 A1* | 9/2020 | Wagatsuma | H01L 21/02326 |
| 2021/0032749 A1 | 2/2021 | Trinh et al. | |

FOREIGN PATENT DOCUMENTS

WO    2019060069 A1    3/2019

* cited by examiner

*Primary Examiner* — Marvin Payen
(74) *Attorney, Agent, or Firm* — Servilla Whitney LLC

(57) ABSTRACT

Methods of forming a stack without damaging underlying layers are discussed. The encapsulation layer and dielectric layer are highly conformal, have low etch rates, and good hermeticity. These films may be used to protect chalcogen materials in PCRAM devices or any substrates sensitive to oxygen or moisture. Some embodiments utilize a two-step process comprising a first ALD process to form an encapsulation layer and oxidation process to form a dielectric layer.

20 Claims, 4 Drawing Sheets

LOW TEMPERATURE SILICON NITRIDE/SILICON OXYNITRIDE STACK FILM WITH TUNABLE DIELECTRIC CONSTANT

TECHNICAL FIELD

Embodiments of the disclosure generally relate to the fabrication of semiconductors, including processes for forming multilayer encapsulation stacks. More particularly, certain embodiments of the disclosure are directed to methods for forming encapsulation stacks for substrates that are sensitive to Oxygen, oxygen plasma, or oxygen containing compounds (e.g., water).

BACKGROUND

Phase change random-access memory (PCRAM) is a type of emerging non-volatile memory with an increasing number of applications and fast market growth. PCRAM relies on a phase change layer consisting of a chalcogenide material. The chalcogenide materials are sensitive to air and moisture. Silicon nitride (SiN) thin films can be used as encapsulation layers to protect the chalcogenide materials.

Many conventional methods used to deposit SiN films have drawbacks. Some methods, such as chemical vapor deposition (CVD), rely on higher temperatures that can damage devices. Some methods, such as plasma enhanced chemical vapor deposition (PECVD), are able to deposit at lower temperatures, but require subsequent post treatment to improve film quality.

The PECVD processes are also limited by poor step coverage and the film quality may strongly depend on the post treatment efficiency. As device density continues to increase, these processes are not extendable to the next generation of device with larger aspect ratios.

The PCRAM stacks contain materials which are sensitive to other processing conditions as well. For example, some PCRAM stacks use a stack of silicon nitride (SiN) as a protective layer with a dielectric layer with a low dielectric constant ($\kappa<7$), such as silicon oxynitride (SiON), silicon oxide ($SiO_x$), or silicon carbooxynitride (SiCON) layers as a liner. An ideal process for forming a SiN/low K layer stack would be able to be performed without damaging the underlying materials, would provide suitable protection against oxygen, water, and moisture, and would have a tunable dielectric constant. There are many other semiconductor manufacturing processes that require similar SiN/low k dielectric layer to be processed on substrates that are sensitive to oxygen, oxygen plasma, or oxygen containing compounds such as water.

Therefore, there is a need in the art for methods of forming conformal dielectric layers with tunable k value on high aspect ratio features which limit damage to the underlying layers and satisfy manufacturing requirements.

SUMMARY

One or more embodiments of the disclosure are directed to a method of forming a stack. In one or more embodiments, the method comprises forming an encapsulation layer on a substrate, the substrate having at least one feature, the hermetic encapsulation layer comprising one or more of silicon nitride (SiN) or silicon carbonitride (SiCN); and oxidizing the encapsulation layer to form a dielectric layer having a dielectric constant in a range of from 4.0 to less than 7.0. The substrate is substantially undamaged by the method.

Additional embodiments of the disclosure are directed to a method of forming a stack. In one or more embodiments, the method comprises sequentially exposing a substrate to a silicon precursor and a nitrogen precursor, and optionally a plasma, to form an encapsulation layer, the encapsulation layer comprising one or more of silicon nitride and silicon carbonitride, and the substrate having at least one feature with an aspect ratio greater than or equal to 1:1; and exposing the encapsulation layer to one or more of an oxygen-containing plasma and an oxidizing reagent to form a dielectric layer comprising one or more of silicon oxynitride (SiON) and silicon carbooxynitride (SiCON), the dielectric layer having a dielectric constant in a range of from 4.0 to less than 7.0.

BRIEF DESCRIPTION OF THE DRAWINGS

So that the manner in which the above recited features of the disclosure can be understood in detail, a more particular description of the disclosure, briefly summarized above, may be had by reference to embodiments, some of which are illustrated in the appended drawings. It is to be noted, however, that the appended drawings illustrate only typical embodiments of the disclosure and are therefore not to be considered limiting of its scope, for the disclosure may admit to other equally effective embodiments.

Figure 1:
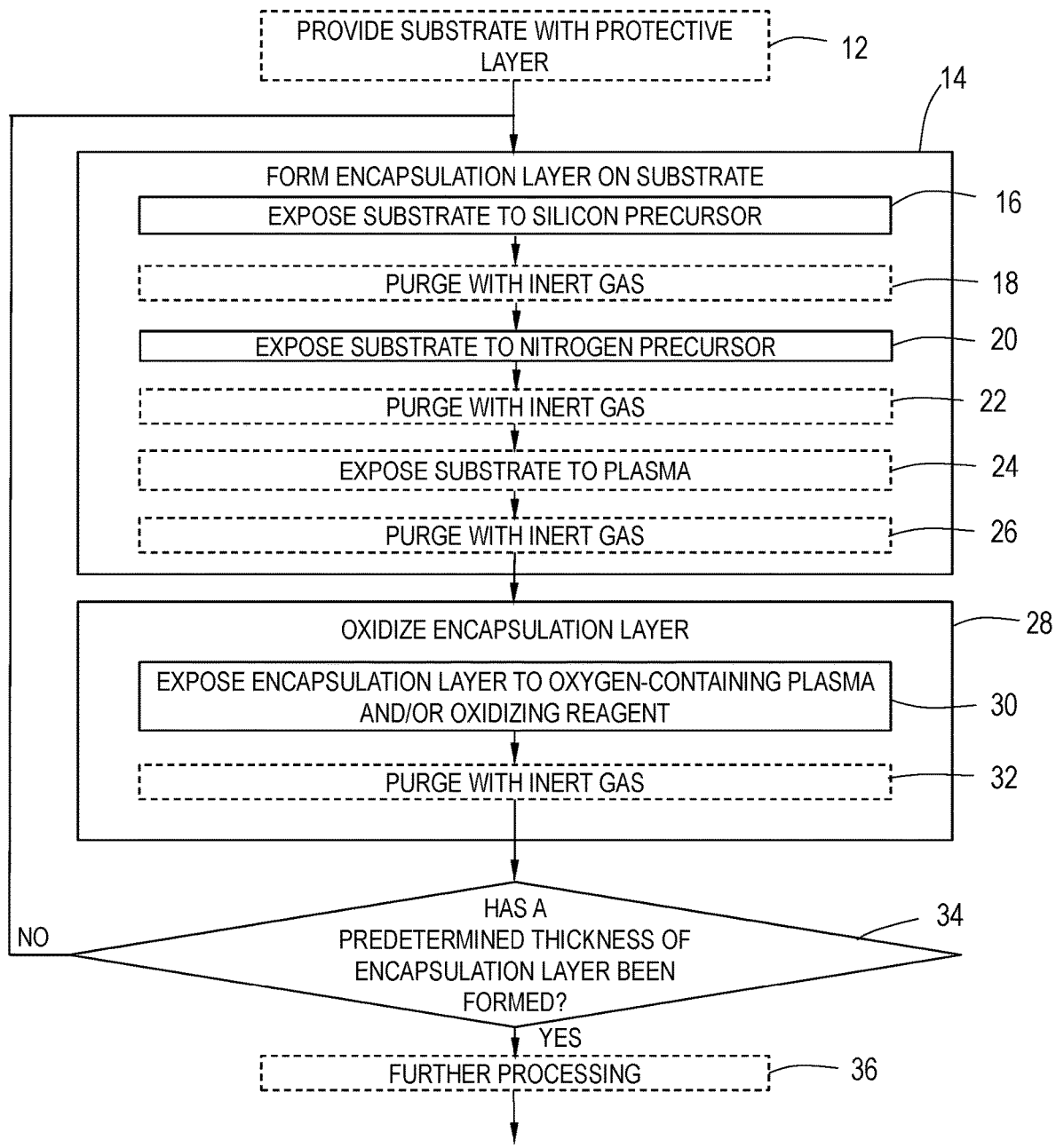
FIG. 1 illustrates a process flow diagram for an exemplary method according to one or more embodiments of the disclosure.

In the appended figures, similar components and/or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label.

DETAILED DESCRIPTION

Before describing several exemplary embodiments of the disclosure, it is to be understood that the disclosure is not limited to the details of construction or process steps set forth in the following description. The disclosure is capable of other embodiments and of being practiced or being carried out in various ways.

A "substrate", "substrate surface", or the like, as used herein, refers to any substrate or material surface formed on a substrate upon which processing is performed. For example, a substrate surface on which processing can be performed include, but are not limited to, materials such as silicon, silicon oxide, strained silicon, silicon on insulator (SOI), carbon doped silicon oxides, silicon nitride, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate (or otherwise generate or graft target chemical moieties to impart chemical functionality), anneal and/or bake the substrate surface. In addition to processing directly on the surface of the substrate itself, in the present disclosure, any of the film processing steps disclosed may also be performed on an underlayer formed on the substrate as disclosed in more detail below, and the term "substrate surface" is intended to include such underlayer as the context indicates. Thus for example, where a film/layer or partial film/layer has been deposited onto a substrate surface, the exposed surface of the newly deposited film/layer becomes the substrate surface. What a given substrate surface comprises will depend on what materials are to be deposited, as well as the particular chemistry used.

"Atomic layer deposition" or "cyclical deposition" as used herein refers to the sequential exposure of two or more reactive compounds to deposit a layer of material on a substrate surface. As used in this specification and the appended claims, the terms "reactive compound", "reactive gas", "reactive species", "precursor", "process gas" and the like are used interchangeably to mean a substance with a species capable of reacting with the substrate surface or material on the substrate surface in a surface reaction (e.g., chemisorption, oxidation, reduction). The substrate, or portion of the substrate, is exposed separately to the two or more reactive compounds which are introduced into a reaction zone of a processing chamber. In a time-domain ALD process, exposure to each reactive compound is separated by a time delay to allow each compound to adhere and/or react on the substrate surface and then be purged from the processing chamber. These reactive compounds are said to be exposed to the substrate sequentially. In a spatial ALD process, different portions of the substrate surface, or material on the substrate surface, are exposed simultaneously to the two or more reactive compounds so that any given point on the substrate is substantially not exposed to more than one reactive compound simultaneously. As used in this specification and the appended claims, the term "substantially" used in this respect means, as will be understood by those skilled in the art, that there is the possibility that a small portion of the substrate may be exposed to multiple reactive gases simultaneously due to diffusion, and that the simultaneous exposure is unintended.

In one aspect of a time-domain ALD process, a first reactive gas (i.e., a first precursor or compound A) is pulsed into the reaction zone followed by a first time delay. Next, a second precursor or compound B is pulsed into the reaction zone followed by a second delay. During each time delay, a purge gas, such as argon, is introduced into the processing chamber to purge the reaction zone or otherwise remove any residual reactive compound or reaction by-products from the reaction zone. Alternatively, the purge gas may flow continuously throughout the deposition process so that only the purge gas flows during the time delay between pulses of reactive compounds. The reactive compounds are alternatively pulsed until a desired film or film thickness is formed on the substrate surface. In either scenario, the ALD process of pulsing compound A, purge gas, compound B and purge gas is a cycle. A cycle can start with either compound A or compound B and continue the respective order of the cycle until achieving a film with the predetermined thickness.

In an embodiment of a spatial ALD process, a first reactive gas and second reactive gas are delivered simultaneously to the reaction zone but are separated by an inert gas curtain and/or a vacuum curtain. The substrate is moved relative to the gas delivery apparatus so that any given point on the substrate is exposed to the first reactive gas and the second reactive gas.

In an embodiment of a spatial ALD process, a first reactive gas and second reactive gas are delivered simultaneously to the reaction zone but are separated by an inert gas curtain and/or a vacuum curtain. The substrate is moved relative to the gas delivery apparatus so that any given point on the substrate is exposed to the first reactive gas and the second reactive gas.

As used in this specification and the appended claims, the terms "precursor", "reactant", "reactive gas" and the like are used interchangeably to refer to any gaseous species that can react with the substrate surface.

A "pulse" or "dose" as used herein is intended to refer to a quantity of a process gas that is intermittently or non-continuously introduced into the process chamber. The quantity of a particular compound within each pulse may vary over time, depending on the duration of the pulse. A particular process gas may include a single compound or a mixture/combination of two or more compounds, for example, the process gases described below.

The durations for each pulse/dose are variable and may be adjusted to accommodate, for example, the volume capacity of the processing chamber as well as the capabilities of a vacuum system coupled thereto. Additionally, the dose time of a process gas may vary according to the flow rate of the process gas, the temperature of the process gas, the type of control valve, the type of process chamber employed, as well as the ability of the components of the process gas to adsorb onto the substrate surface. Dose times may also vary based upon the type of layer being formed and the geometry of the device being formed. A dose time should be long enough to provide a volume of compound sufficient to adsorb/chemisorb onto substantially the entire surface of the substrate and form a layer of a process gas component thereon.

The embodiments of the disclosure are described by way of the Figures, which illustrate devices and processes for forming devices in accordance with one or more embodiments of the disclosure. The processes shown are merely illustrative possible uses for the disclosed processes, and the skilled artisan will recognize that the disclosed processes are not limited to the illustrated applications.

With reference to FIG. 1, one or more embodiments of the disclosure are directed to a method for forming a stack on a substrate with at least one feature. As used in this regard, the term "feature" means any intentional surface irregularity. Suitable examples of features include, but are not limited to, trenches, which have a top, two sidewalls and a bottom, and peaks, which have a top and two sidewalls. Features can have any suitable aspect ratio (ratio of the depth of the feature to the width of the feature).

Figure 2:
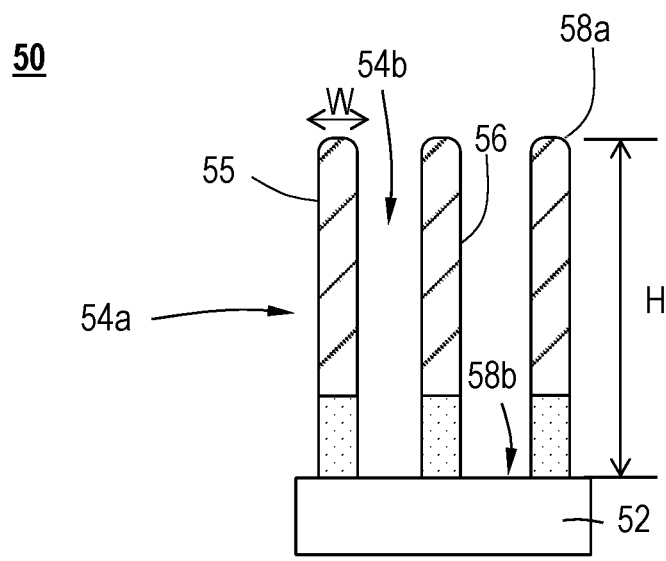
FIG. 2 illustrates a schematic representation of a substrate with multiple features in accordance with one or more embodiments of the disclosure.

In one or more embodiments, the at least one feature of the substrate may be formed by various patterning and etching processes known in the art. FIG. 1 illustrates an exemplary method 10 for forming an encapsulation layer on the surface of the substrate feature. FIG. 2 illustrates an exemplary device 50 comprising a substrate 52 with at least one feature 54a, 54b formed thereon/therein. As used in this disclosure, the term "feature" and reference numeral 54 is used as a general term for both positive features and negative features. The device 50 shown in FIG. 2 comprises features 54a which extend from the substrate 52, also referred to as positive features, and features 54b which are recessed into the substrate 52, also referred to as negative features.

While the substrate and features shown in FIG. 2 are shown as being composed of different materials, no inference of the material composition should be interpreted from FIG. 2.

In one or more embodiments, the feature 54 has an exposed surface 55. The surface 55 of the features 54a, 54b may comprise at least one sidewall 56 and a top 58a or bottom 58b. Those skilled in the art will recognize that in practice, a device 50 may contain multiple positive features 54a positioned near each other, as shown in FIG. 2. Accordingly, the space (also referred to as a gap or trench) between two positive features 54a may create a negative feature 54b.

In some embodiments, the feature 54a has a height H and a width W. The feature 54a of some embodiments is a rectangular prism shaped object with elongated sidewalls connected by shorter end walls (not shown). In some embodiments, the positive feature 54a is a cylindrical stack and the negative feature 54b is a via with at least one round sidewall and a top or bottom. In some embodiments, the feature 54 has an aspect ratio of greater than or equal to about 1:1, about 5:1, about 10:1, about 15:1, about 20:1, about 25:1, about 30:1, about 35:1 or about 40:1. As used in this regard, the aspect ratio of a feature is defined as the height H divided by the width W.

Figure 3A:
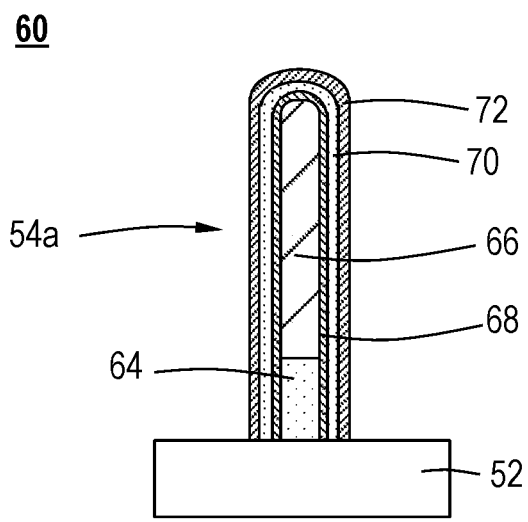
FIG. 3A illustrates a schematic representation of a substrate with a feature thereon in accordance with one or more embodiments of the disclosure.
Figure 3B:
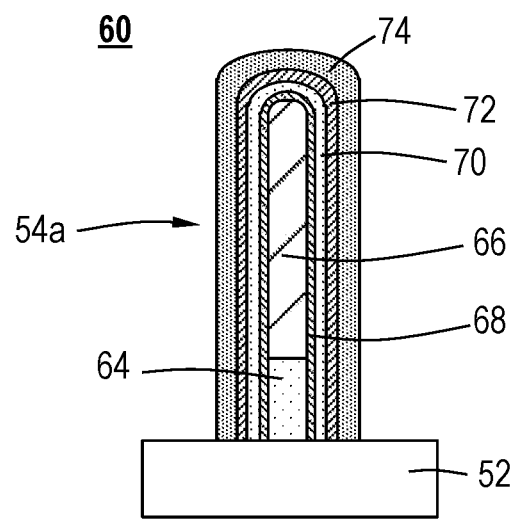
FIG. 3B illustrates a schematic representation of a substrate with a feature thereon in accordance with one or more embodiments of the disclosure.

FIGS. 3A and 3B illustrates an exemplary device 60 having a substrate 52 with a single positive feature 54a according to one or more embodiments. As illustrated in FIG. 3A, in some embodiments, the feature 54a comprises different materials 64,66. While two materials 64,66 are shown in FIG. 3A, the feature may also comprise more materials or fewer materials. In some embodiments, the first material 64 may be the same or different from the material of the substrate 52 and the first material 64 and second material 66 form the feature 54a. In some embodiments, a third material 68 is deposited conformally over the first material 64 and second material 66. In some embodiments, a fourth material 70 is deposited conformally over the third material 68. The arrangement of material layers shown in FIG. 3 is intended to be exemplary and is not intended to be limiting.

In some embodiments, the first and second materials 64, 66 are sensitive to air or moisture. In some embodiments, the first and second materials 64, 66 are sensitive to oxygen. In some embodiments, the first and second materials 64, 66 are sensitive to water. As used in this regard, a material is "sensitive" to an environment or a species within an environment, if exposure to the environment or species alters the properties of the material. The property of the material that is altered may be altered as the result of a physical change (e.g., crystallinity, volatility) or a chemical change (e.g., oxidation state, contamination, materials loss, change in composition of materials).

In some embodiments, the first material 64, the second material 66, the third material 68, and the fourth material 70 independently comprise one or more of silicon, silicon oxide, a chalcogen material, carbon, and a metal. As used in this regard, a "chalcogen material" is any material comprising a chalcogen. Exemplary chalcogens include, but are not limited to, sulfur, selenium, tellurium, and polonium. In some embodiments, the chalcogen material comprises a chalcogen and an element from Group 14 or Group 15 of the Periodic Table. In some embodiments, the third material 70 comprises one or more of AsS, GeS, GeSbTe, or GeSiAsTe.

In one or more embodiments, the first material 64, the second material 66, the third material 68, and the fourth material 70 independently comprise one or more of selenium (Se), tellurium (Te), sulfur (S), antimony (Sb), arsenic (As), indium (In), germanium (Ge), tungsten (W), carbon (C), silicon (Si), and nitrogen (N).

As the fourth material 70 may be sensitive to air and moisture, in some embodiments an encapsulation layer 72 is formed over the fourth material 70. In some embodiments, the encapsulation layer 72 protects at least the fourth material 70. In some embodiments, the encapsulation layer 72 is continuous over the fourth material 70. In some embodiments, the encapsulation layer 72 is continuous over the surface of the feature 54a regardless of the surface's composition. In one or more embodiments, the encapsulation layer 72 is conformal over the surface of the fourth material 70.

In some embodiments, the encapsulation layer 72 is hermetic. As used in this regard, a "hermetic" layer is resistant to oxidation by exposure to air or water. In some embodiments, the encapsulation layer 72 comprises one or more of silicon nitride (SiN) or silicon carbonitride (SiCN).

The encapsulation layer 72 may be exposed to oxidative test conditions to test the hermeticity of the encapsulation layer 72. Oxidative test conditions may include plasma enhanced atomic layer deposition of silicon oxide (60 Å using BDEAS and 50 W $O_2$/Ar plasma) on the stack surface, exposure to a low powered (e.g. 50 W) $O_2$/Ar plasma, or exposure to steam at an elevated temperature (e.g. 400° C.) for an extended period of time (e.g. 2 hours). Regardless of the test method, the depth of oxygen atoms within the film provides an indication of the hermeticity of the film, (i.e. shallower depths of oxidation indicate better or higher hermeticity). In some embodiments, the encapsulation layer 72 demonstrates less than or equal to about 5 Å of oxidation under oxidative test conditions, less than or equal to about 4 Å of oxidation under oxidative test conditions, less than or equal to about 3 Å of oxidation under oxidative test conditions, or less than or equal to about 2 Å of oxidation under oxidative test conditions.

In one or more embodiments, the encapsulation layer 70 has a dielectric constant that is greater than 7. Without intending to be bound by theory, a stack having a dielectric constant less than 7 is desired.

Accordingly, with reference to FIG. 3B, in one or more embodiments, the encapsulation layer 72 is oxidized to form a dielectric layer 74 having a dielectric constant less than 7.0. In some embodiments, the dielectric layer 74 has a dielectric constant in a range of from 4.0 to less than 7.0.

In one or more embodiments, the dielectric layer 74 comprises one or more of silicon oxynitride (SiON) and silicon carbooxynitride (SiCON).

With reference to FIG. 1, the method 10 generally begins at operation 12 by providing a substrate 52. As used in this manner, "provided" means that the substrate 52 is placed into position or a suitable environment for processing. The substrate 52 has at least one feature 54 with a surface 55.

At operation 14, an encapsulation layer 72 is formed on the feature 54a. In some embodiments, the encapsulation layer 72 is conformal. In some embodiments, the encapsulation layer comprises one or more of silicon nitride (SiN) and silicon carbonitride (SiCN). In some embodiments, the encapsulation layer 72 comprises silicon nitride (SiN). In some embodiments, the encapsulation layer 72 comprises silicon carbonitride. The encapsulation layer 72 may be formed by sequentially exposing the substrate to a first reactant and a second reactant. In some embodiments, the exposures are repeated in a cyclical deposition process, such as atomic layer deposition (ALD), or the like.

The process of forming the encapsulation layer 72 may begin by exposing the substrate to a first reactive gas comprising a first reactant. The first reactive gas is exposed to the substrate for a first period of time, as shown at operation 16. At operation 16, the first reactant adsorbs to the surface 55.

The first reactant may be any suitable reactant for forming the encapsulation layer 72. In some embodiments, the first reactant comprises a silicon precursor. Suitable silicon precursors include but are not limited to $SiX_4$, where X is a halogen-like group; trisilyl amines (e.g. $N(SiH_3)_2$; or $SiR_aX_b$, where R is an organic group or H and a+b=4. Halogen-like groups include but are not limited to —Cl, —Br, —I, —CN, —CP, —OCN, —NCO, —SCN, —SeCN, and —$N_3$. Without being bound by theory, the Si—X bond of the silicon precursor is reactive, such that X can be replaced by nitrogen from the nitrogen precursor. In some embodiments, the first reactant does not contain any halogen atoms. In some embodiments, the first reactant comprises or consists essentially $SiX_4$ or $SiH_aX_b$, a+b=4, where X is a halogen (X=Cl, Br, I). In some embodiments, the first reactant comprises on or more of $SiCl_4$, $SiBr_4$, $SiI_4$, $SiH_2Cl_2$ or $SiH_2I_2$.

In one or more embodiments, the first reactant comprises a silicon precursor. The silicon precursor is selected from one or more of diiodosilane (DIS), dichlorosilane (DCS), silicon tetrabromide, silicon tetraiodide, iodine containing precursors, halogen-free silicon precursors, pseudo halogen silicon precursors, sulfur-containing silicon precursors, amino silane precursors, silane precursors, and derivatives thereof.

At operation 18, the process chamber (especially in time-domain ALD) may be purged using an inert gas. The inert gas may be any inert gas, for example, such as argon (Ar), helium (He), neon (Ne), nitrogen ($N_2$), or the like. In some embodiments, the inert gas may be the same, or alternatively, may be different from the inert gas provided to the process chamber during the exposure of the substrate to the first reactant at operation 16. In embodiments where the inert gas is the same, the purge may be performed by diverting the first reactive gas from the process chamber, allowing the inert gas to flow through the process chamber, purging the process chamber of any excess first process gas components or reaction byproducts. In some embodiments, the inert gas may be provided at the same flow rate used in conjunction with the first reactive gas, described above, or in some embodiments, the flow rate may be increased or decreased. For example, in some embodiments, the inert gas may be provided to the process chamber at a flow rate of about 0 to about 60,000 sccm to purge the process chamber.

In spatial ALD, purge gas curtains may be maintained between the flows of reactive gases and purging the process chamber may not be necessary. In some embodiments of a spatial ALD process, the process chamber or region of the process chamber may be purged with an inert gas.

The flow of inert gas may facilitate removing any excess first process gas components and/or excess reaction byproducts from the process chamber to prevent unwanted gas phase reactions of the first and second process gases. For example, the flow of inert gas may remove excess silicon precursor from the process chamber, preventing a gas phase reaction between the silicon precursor and a subsequent reactive gas.

The process of forming the encapsulation layer 72 at operation 14 continues by exposing the substrate to a second reactive gas comprising a second reactant. The second reactive gas is exposed to the substrate for a second period of time, as shown at operation 20. The second reactant reacts with the first reactant adsorbed on the substrate surface to form an encapsulation layer 72.

In some embodiments, the second reactant comprises a nitrogen precursor. In some embodiments, the nitrogen precursor comprises or consists essentially of one or more of nitrogen gas ($N_2$), ammonia ($NH_3$), hydrazine ($N_2H_4$), amines, $NR_xH_y$, where R contains a carbon, $H_2N$—R—$NH_2$ where R is an organic substituent containing carbon, and derivatives thereof (e.g., alkylamine, alkyl hydrazine).

In one or more embodiments, the encapsulation layer 72 comprises one or more of silicon nitride (SiN) and silicon carbonitride (SiCN). In some embodiments, the encapsulation layer 72 comprises silicon nitride (SiN). In some embodiments, the encapsulation layer 72 comprises silicon carbonitride (SiCN).

In some embodiments, the process of forming the encapsulation layer 72 comprises substantially no plasma. Stated differently, in some embodiments, the encapsulation layer is formed by a thermal ALD process.

In other embodiments, the process of forming the encapsulation layer 72 comprises exposing the substrate to a plasma. In some embodiments, the plasma is a plasma of the second reactant. In these embodiments, at operation 20, the substrate is exposed to the second process gas comprising the plasma.

At operation 22, the processing chamber is optionally purged after exposure to the nitrogen precursor. Purging the processing chamber in operation 22 can be the same process or different process than the purge in operation 18. Purging the processing chamber, portion of the processing chamber, area adjacent the substrate surface, etc., removes unreacted precursors, reaction products and by-products from the area adjacent the substrate surface.

In some embodiments, the process of forming the encapsulation layer at operation 14 includes a separate plasma exposure at operation 24. In some embodiments, the plasma exposure at operation 24 is separated from other processes by purging with inert gas at operation 22 and operation 26. For example, in some embodiments, the second process gas comprises ammonia or amines and the plasma comprises a plasma generated from a gas mixture that contains nitrogen. In some embodiments, the second process gas comprises a plasma generated from ammonia gas. In other embodiments, the plasma comprises one or more of nitrogen ($N_2$), hydrogen ($H_2$), ammonia ($NH_3$), helium (He), and argon (Ar).

In some embodiments, the plasma is generated from a plasma gas comprising one or more of nitrogen gas, argon gas, helium, ammonia or one of the nitrogen-containing second reactants identified above. In some embodiments, the plasma is generated from a mixture of argon and nitrogen gasses. The ratio of argon and nitrogen gasses can be adjusted to affect the deposition rate of the protective later as well as properties of the formed encapsulation layer. In some embodiments, the ratio of argon:nitrogen is in a range of about 1:100 to about 100:1. In some embodiments, the ratio of argon:nitrogen is greater than or equal to about 1:1, greater than or equal to about 2:1, greater than or equal to about 4:1, or greater than or equal to about 9:1.

In one or more embodiments, the plasma may be generated remotely or within the processing chamber. The plasma may be a microwave plasma, an inductively coupled plasma (ICP), or a conductively coupled plasma (CCP). Any suitable power can be used depending on, for example, the reactants, or the other process conditions. In some embodiments, the plasma is generated with a plasma power in the range of about 10 W to about 400 W. In some embodiments, the plasma is a microwave plasma generated with a plasma power in the range of about 10 W to about 2000 W. In some embodiments, the plasma is generated with a plasma power less than or equal to about 200 W, less than or equal to about 150 W, less than or equal to about 100 W, less than or equal to about 50 W, or less than or equal to about 35 W.

In some embodiments, the temperature of the substrate is maintained while the encapsulation layer 72 is formed at operation 14. In some embodiments, the substrate is maintained at a temperature in the range of about 200° C. to about 500° C., about 200° C. to about 300° C., about 200° C. to about 280° C., about 200° C. to about 250° C., or about 100° C. to about 200° C. In some embodiments, the substrate is maintained at a temperature less than or equal to about 400° C., less than or equal to about 300° C., less than or equal to about 280° C., or less than or equal to about 250° C. In some embodiments, the substrate is maintained at a temperature of about 250° C.

At operation 26, the processing chamber is optionally purged after exposure to the plasma. Purging the processing chamber in operation 26 can be the same process or different process than the purge in operation 18 or purge operation 22. Purging the processing chamber, portion of the processing chamber, area adjacent the substrate surface, etc., removes unreacted precursors, reaction products and by-products from the area adjacent the substrate surface.

The various process parameters for depositing the encapsulation layer 72 may be varied. In some embodiments, the substrate is exposed to the first reactant for a first period of time and the substrate is exposed to the second reactant for a second, different, period of time, and optionally the substrate is exposed to the plasma for a third, different, period of time.

The pressure at which the substrate surface is exposed to each of the process gases and/or the plasma can be varied depending on, for example, the reactants selected and other process conditions (e.g., temperature). In some embodiments, exposure to each of the precursors occurs at a pressure in the range of about 3 Torr to about 100 Torr. In one or more embodiments, exposure to each of the precursors occurs at a pressure in the range of about 3 Torr to about 100 Torr, or in the range of about 10 Torr to about 80 Torr, or in the range of about 15 Torr to about 50 Torr. In some embodiments, exposure to each of the precursors occurs at a pressure greater than or equal to about 3 Torr, greater than or equal to about 10 Torr, greater than or equal to about 15 Torr, or greater than or equal to about 20 Torr.

As stated previously. in some embodiments, the encapsulation layer 72 is substantially conformal to the substrate surface. As used in this regard, the term "conformal" means that the thickness of the layer is uniform across the substrate surface. As used in this specification and the appended claims, the term "substantially conformal" means that the thickness of the layer does not vary by more than about 40%, 30%, 20%, 10%, 5%, 2%, 1%, or 0.5% relative to the average thickness of the layer. Stated differently a layer which is substantially conformal has a conformality of greater than about 60%, 70%, 80%, 90%, 95%, 98%, 99% or 99.5%.

At operation 28, the encapsulation layer 72 is oxidized to form a dielectric layer 74. In one or more embodiments, the dielectric layer 74 has a dielectric constant less than 7, including less than 6, less than 5, less than 4, and less than 3. In some embodiments, the dielectric layer 74 has a dielectric constant in a range of from 4.0 to less than 7. In some embodiments, the dielectric layer 74 is conformal. In some embodiments, the dielectric layer 74 comprises one or more of silicon oxynitride (SiON) and silicon carbooxynitride (SiCON). In some embodiments, the dielectric layer 74 comprises silicon oxynitride ($SiO_xN_y$). In some embodiments, the dielectric layer 74 comprises silicon carbooxynitride ($SiC_xO_yN_z$).

In one or more embodiments, the dielectric layer 74 may be formed by sequentially exposing the exposing the encapsulation layer 72 to one or more of an oxygen-containing plasma and an oxidizing reagent.

In one or more embodiments, the oxygen-containing plasma is selected from one or more of oxygen ($O_2$) plasma, oxygen/argon ($O_2$/Ar) plasma, oxygen/helium ($O_2$/He) plasma, carbon dioxide ($CO_2$) plasma, carbon monoxide (CO) plasma, and nitrous oxide ($N_2O$) plasma. In some embodiments, the oxidizing reagent is selected from one or more of oxygen ($O_2$), water ($H_2O$), hydrogen peroxide ($H_2O_2$), ozone ($O_3$), and nitrous oxide ($N_2O$).

In some embodiments, the oxygen-containing plasma is generated from a plasma gas comprising one or more of one or more of oxygen ($O_2$) gas, argon (Ar) gas, helium (He) gas, carbon dioxide ($CO_2$) gas, carbon monoxide (CO) gas, and nitrous oxide ($N_2O$) gas. In some embodiments, the plasma is generated from a mixture of argon and an oxygen-containing gas selected from one or more of oxygen ($O_2$) gas, carbon dioxide ($CO_2$) gas, carbon monoxide (CO) gas, and nitrous oxide ($N_2O$) gas. The ratio of argon and oxygen-containing gasses can be adjusted to affect the deposition rate as well as properties of the formed dielectric layer. In some embodiments, the ratio of argon:oxygen-containing gas is in a range of about 1:100 to about 100:1. In some embodiments, the ratio of argon:oxygen-containing gas is greater than or equal to about 1:1, greater than or equal to about 2:1, greater than or equal to about 4:1, or greater than or equal to about 9:1.

In one or more embodiments, the oxygen-containing plasma may be generated remotely or within the processing chamber. The oxygen-containing plasma may be a microwave plasma, an inductively coupled plasma (ICP), or a conductively coupled plasma (CCP). Any suitable power can be used depending on, for example, the reactants, or the other process conditions. In some embodiments, the oxygen-containing plasma is generated with a plasma power in the range of about 10 W to about 400 W. In some embodiments, the oxygen-containing plasma is a microwave plasma generated with a plasma power in the range of about 10 W to about 2000 W. In some embodiments, the oxygen-containing plasma is generated with a plasma power less than or equal to about 200 W, less than or equal to about 150 W, less than or equal to about 100 W, less than or equal to about 50 W, or less than or equal to about 35 W. In one or more embodiments, the exposure time to the plasma can be varied from 0.1 sec to 100 min, or 1 sec to 5 sec, or 12 sec to 24 sec, or 120 sec to 600 sec to control the oxygen content of the film.

In some embodiments, the temperature of the substrate is maintained while the encapsulation layer 72 is oxidized at operation 28. In some embodiments, the substrate is maintained at a temperature in the range of about 100° C. to about 500° C., about 200° C. to about 300° C., about 200° C. to about 280° C., or about 200° C. to about 250° C. In some embodiments, the substrate is maintained at a temperature less than or equal to about 400° C., less than or equal to about 300° C., less than or equal to about 280° C., or less than or equal to about 250° C. In some embodiments, the substrate is maintained at a temperature of about 250° C.

At operation 32, the processing chamber is optionally purged after exposure to the oxygen-containing plasma. Purging the processing chamber in operation 32 can be the same process or different process than the purge in operation 18 or purge in operation 22 or purge in operation 26. Purging the processing chamber, portion of the processing chamber, area adjacent the substrate surface, etc., removes unreacted precursors, reaction products and by-products from the area adjacent the substrate surface.

In one or more embodiments, at decision post 34, it is determined whether the encapsulation layer 72 has been formed to a predetermined thickness. If the predetermined thickness has not been achieved, the method 10 returns to operation 14 to continue forming the encapsulation layer 72 until the predetermined thickness is reached. Once the predetermined thickness has been reached, the method 10 proceeds to operation 36 for further processing. In some embodiments, the encapsulation layer may be deposited with a thickness in a range of 5 Å to 50 Å, 10 Å to 50 Å, or in some embodiments, 20 Å to 30 Å. In some embodiments, the encapsulation layer 72 has a thickness of 5 Å, 10 Å, 15 Å, 20 Å, 25 Å, 30 Å or 35 Å. In one or more embodiments, the encapsulation layer 72 has a thickness of greater than or equal to 10 Å.

Without being bound by theory, the inventors have found that damage to the underlying substrate may be minimized by maximizing the growth rate of the encapsulation layer. The growth rate of the encapsulation layer 72 may be evaluated in terms of growth per cycle (GPC), where each ALD cycle deposits an average thickness. The growth rate of the encapsulation layer 72 may also be evaluated in terms of growth per minute (GPM), where total growth is divided by total processing time.

In some embodiments, the growth rate is greater than or equal to about 0.10 Å/cycle, greater than or equal to about 0.25 Å/cycle, greater than or equal to about 0.3 Å/cycle, greater than or equal to about 0.4 Å/cycle, or greater than or equal to about 0.5 Å/cycle, or greater than or equal to about 1.0 Å/cycle, greater than or equal to about 1.5 Å/cycle In some embodiments, a spatial ALD apparatus is utilized. In some embodiments, each full rotation corresponds to two ALD cycles. Accordingly, growth rates can also be expressed in GPM when the revolutions per minutes (RPM) is also known.

In some embodiments, the RPM is in a range of about 1 RPM to about 50 RPM, about 1 RPM to about 20 RPM, about 1 RPM to about 10 RPM, or about 1 RPM to about 5 RPM. In some embodiments, the RPM is about 2 RPM, about 3 RPM, about 5 RPM, about 10 RPM or about 20 RPM. In some embodiments, the exposure time for each operation in 14 and 28 are controlled by time, the time can varied from 0.1 sec to 100 minutes.

In some embodiments, the growth rate is greater than or equal to about 1 Å/min, greater than or equal to about 2 Å/min, greater than or equal to about 5 Å/min, greater than or equal to about 10 Å/min, greater than or equal to about 12 Å/min, greater than or equal to about 15 Å/min, greater than or equal to about 18 Å/min, or greater than or equal to about 20 Å/min. In some embodiments, the growth rate is about 20 Å/min.

As discussed elsewhere herein, the disclosed processes also provide minimal damage to the underlying substrate materials. In some embodiments, the process of forming the encapsulation layer does not damage the substrate surface. Stated differently, the disclosed processes leave the stack substantially undamaged.

One method of evaluating the damage caused by a PEALD process comprising an oxygen-containing plasma is by measuring the depth of oxygenation of the underlying substrate materials. In some embodiments, when deposited on a silicon substrate, the depth of oxygenation is less than or equal to about 12 Å, less than or equal to about 10 Å, or less than or equal to about 8 Å.

Figure 4A:
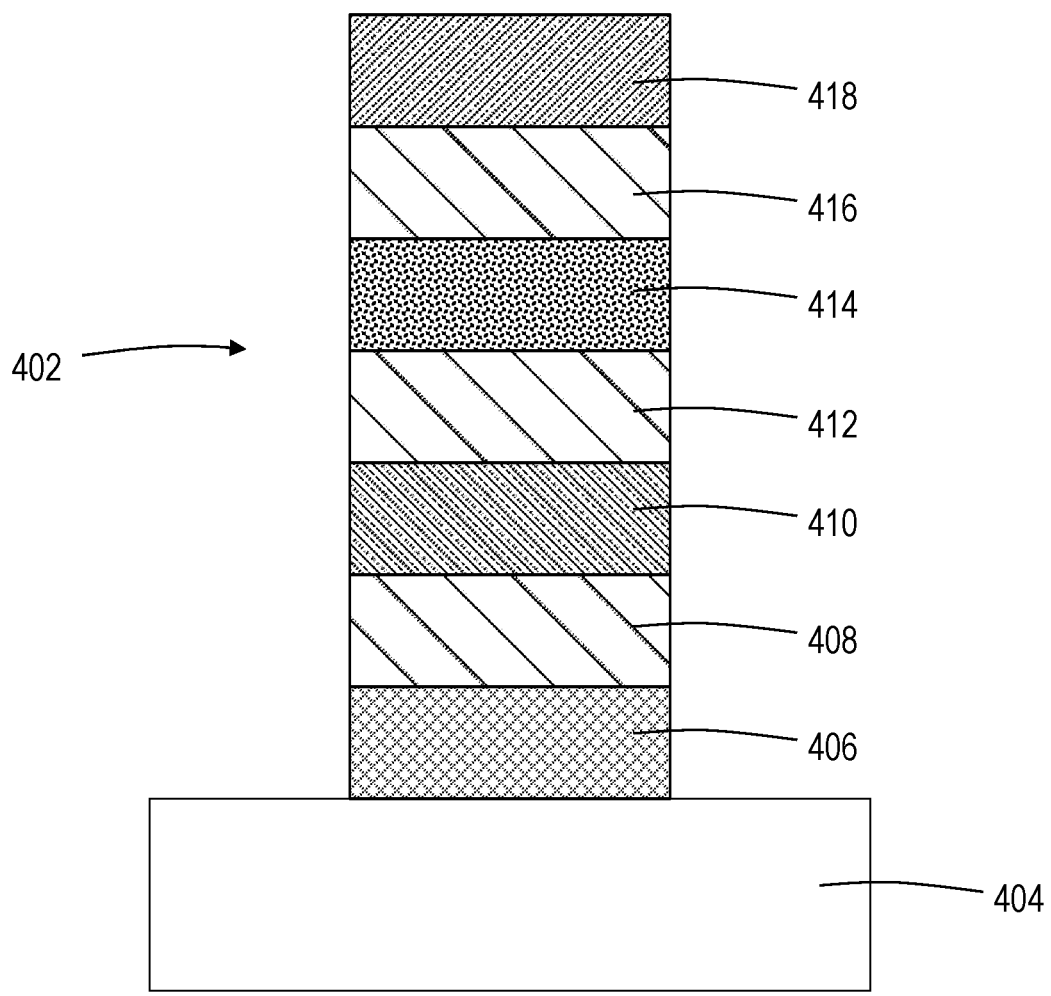
FIG. 4A illustrates an exemplary substrate with a PCRAM stack comprising multiple materials according to one or more embodiments of the disclosure.
Figure 4B:
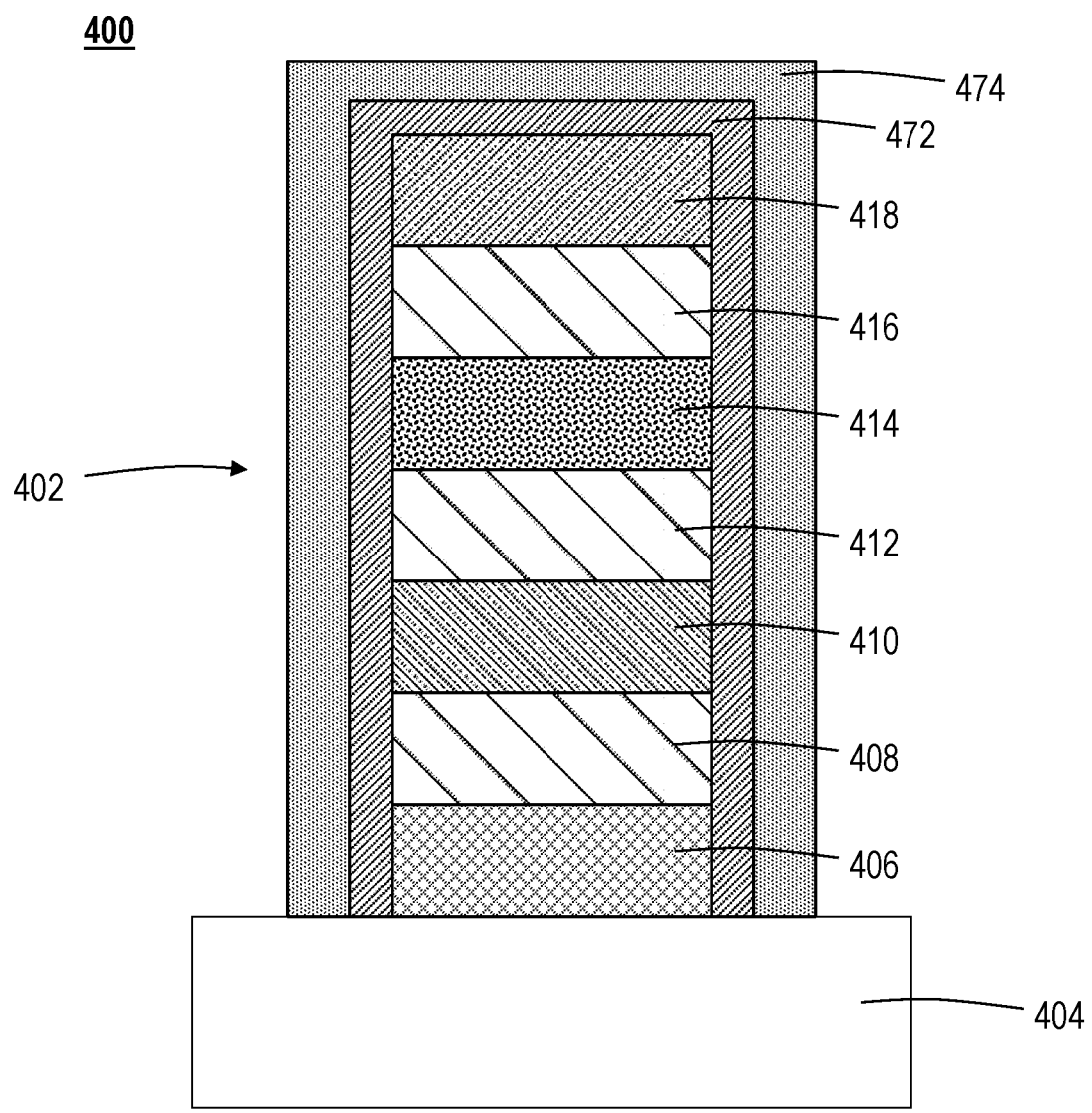
FIG. 4B illustrates an exemplary substrate with a PCRAM stack comprising multiple materials according to one or more embodiments of the disclosure.

As illustrated in FIGS. 4A and 4B, in some embodiments, the feature comprises a stack 402 of materials 406-418 on a substrate 404. Accordingly, the surface of the stack 402 comprises multiple material surfaces. Again, the composition, number, and arrangement of materials in the feature shown in FIGS. 4A and 4B is not intended to limit the scope of this disclosure.

In some embodiments, the stack 402 comprises, from bottom to top, a conductor 406, a bottom electrode 408, an ovonic threshold switching (OTS) material 410, a middle electrode 412, germanium-antimony-tellurium (GST) 414, a top electrode 416 and a hard mask 418. In some embodiments, the conductor 406 comprises or consists essentially of tungsten. In some embodiments, at least one of the bottom electrode 408, the middle electrode 412 and the top electrode 416 comprises or consists essentially of carbon. In some embodiments, the OTS material 410 comprises one or more of germanium (Ge), silicon (Si), arsenic (As), or tellurium (Te). In some embodiments, the GST 414 comprises germanium (Ge), antimony (Sb), and tellurium (Te). In some embodiments, the stack 402 is a PCRAM stack.

Referring to FIG. 4B, in one or more embodiments, an encapsulation layer 472 is formed conformally on the surface of the stack 402. The encapsulation layer 472 may be formed according to any of the methods described herein. In one or more embodiments, the encapsulation layer 472 comprises one or more of silicon nitride (SiN) or silicon carbonitride (SiCN).

In one or more embodiments, the encapsulation 472 is oxidized to form a dielectric layer 474. The encapsulation layer 472 is exposed to one or more of an oxygen-containing plasma and an oxidizing reagent to form the dielectric layer 474. The dielectric layer 474 may be formed according to any of the method described herein. In one or more embodiments, the dielectric layer has a dielectric constant less than 7. In some embodiments, the dielectric layer 474 has a dielectric constant in a range of from 4.5 to less than 7.0. In one or more embodiments, the dielectric layer 474 comprises one or more of silicon oxynitride (SiON) and silicon carbooxynitride (SiCON). In some embodiments, the dielectric layer 474 comprises silicon oxynitride (SiON). In other embodiments, the dielectric layer 474 comprises silicon carbooxynitride (SiCON).

Some embodiments of the disclosure are directed to processes that use a reaction chamber with multiple gas ports that can be used for introduction of different chemicals or plasma gases. Spatially, these gas ports (also referred to as channels) are separated by inert purging gases and/or vacuum pumping holes to create a gas curtain that minimizes or eliminates mixing of gases from different gas ports to avoid unwanted gas phase reactions. Wafers moving through these different spatially separated ports get sequential and multiple surface exposures to different chemical or plasma environment so that layer by layer film growth in spatial ALD mode or surface etching process occur. In some embodiments, the processing chamber has modular architectures on gas distribution components and each modular component has independent parameter control (e.g., RF or gas flow) to provide flexibility to control, for example, gas flow and/or RF exposure.

Embodiments of this disclosure advantageously provide methods of depositing a stack at lower temperatures and with minimal damage to the underlying substrate. As used in this regard, "lower temperatures" are evaluated relative to temperatures typically used in thermal CVD and ALD processes.

Some embodiments of this disclosure advantageously provide methods performed at lower temperatures without damage to the underlying substrate materials. Damage to the underlying substrate may be evidenced by a change in film properties (etch rate, density, etc.), a change in elemental composition (oxidation, nitridation, etc.) and/or a change in thickness (etching, expansion, shrinking, etc.).

Some embodiments advantageously provide good hermeticity and effectively protect the underlying materials from air, water, and moisture. Some embodiments advantageously provide encapsulation stacks with higher density and/or lower wet etch rates.

Some embodiments of the disclosure utilize a time-domain ALD process. Said processes can be performed on processing platforms commonly known in the art.

In time-domain ALD embodiments, exposure to each of the process gases are separated by a time delay/pause to allow the components of the process gases to adhere and/or react on the substrate surface. Alternatively, or in combination, in some embodiments, a purge may be performed before and/or after the exposure of the substrate to the process gases, wherein an inert gas is used to perform the purge. For example, a first process gas may be provided to the process chamber followed by a purge with an inert gas. Next, a second process gas may be provided to the process chamber followed by a purge with an inert gas. In some embodiments, the inert gas may be continuously provided to the process chamber and the first process gas may be dosed or pulsed into the process chamber followed by a dose or pulse of the second process gas into the process chamber. In such embodiments, a delay or pause may occur between the dose of the first process gas and the second process gas, allowing the continuous flow of inert gas to purge the process chamber between doses of the process gases.

Some embodiments of the disclosure utilize a spatial ALD process which is performed on a processing platform/processing system as disclosed herein.

The method of one or more embodiments can be performed in the same chamber or in one or more separate processing chambers. In some embodiments, the substrate is moved from the first chamber to a separate, second chamber for further processing. The substrate can be moved directly from the first chamber to the separate processing chamber, or it can be moved from the first chamber to one or more transfer chambers, and then moved to the separate processing chamber. Accordingly, the processing apparatus may comprise multiple chambers in communication with a transfer station. An apparatus of this sort may be referred to as a "cluster tool" or "clustered system," and the like.

Generally, a cluster tool is a modular system comprising multiple chambers which perform various functions including substrate center-finding and orientation, degassing, annealing, deposition and/or etching. According to one or more embodiments, a cluster tool includes at least a first chamber and a central transfer chamber. The central transfer chamber may house a robot that can shuttle substrates between and among processing chambers and load lock chambers. The transfer chamber is typically maintained at a vacuum condition and provides an intermediate stage for shuttling substrates from one chamber to another and/or to a load lock chamber positioned at a front end of the cluster tool. Several well-known cluster tools which may be adapted for the present disclosure are the Olympia®, the Continuum®, and the Trillium®, all available from Applied Materials, Inc., of Santa Clara, Calif. However, the exact arrangement and combination of chambers may be altered for purposes of performing specific steps of a process as described herein. Other processing chambers which may be used include, but are not limited to, cyclical layer deposition (CLD), atomic layer deposition (ALD), chemical vapor deposition (CVD), physical vapor deposition (PVD), etch, pre-clean, chemical clean, thermal treatment such as RTP, plasma nitridation, degas, hydroxylation and other substrate processes. By carrying out processes in a chamber on a cluster tool, surface contamination of the substrate with atmospheric impurities can be avoided without oxidation prior to depositing a subsequent film.

According to one or more embodiments, the substrate is continuously under vacuum or "load lock" conditions, and is not exposed to ambient air when being moved from one chamber to the next. The transfer chambers are thus under vacuum and are "pumped down" under vacuum pressure. Inert gases may be present in the processing chambers or the transfer chambers. In some embodiments, an inert gas is used as a purge gas to remove some or all of the reactants (e.g., reactant). According to one or more embodiments, a purge gas is injected at the exit of the deposition chamber to prevent reactants (e.g., reactant) from moving from the deposition chamber to the transfer chamber and/or additional processing chamber. Thus, the flow of inert gas forms a curtain at the exit of the chamber.

The substrate can be processed in single substrate deposition chambers, where a single substrate is loaded, processed and unloaded before another substrate is processed. The substrate can also be processed in a continuous manner, similar to a conveyer system, in which multiple substrate are individually loaded into a first part of the chamber, move through the chamber and are unloaded from a second part of the chamber. The shape of the chamber and associated conveyer system can form a straight path or curved path. Additionally, the processing chamber may be a carousel in which multiple substrates are moved about a central axis and are exposed to deposition, etch, annealing, cleaning, etc. processes throughout the carousel path.

During processing, the substrate can be heated or cooled. Such heating or cooling can be accomplished by any suitable means including, but not limited to, changing the temperature of the substrate support and flowing heated or cooled gases to the substrate surface. In some embodiments, the substrate support includes a heater/cooler which can be controlled to change the substrate temperature conductively. In one or more embodiments, the gases (either reactive gases or inert gases) being employed are heated or cooled to locally change the substrate temperature. In some embodiments, a heater/cooler is positioned within the chamber adjacent the substrate surface to convectively change the substrate temperature.

The substrate can also be stationary or rotated during processing. A rotating substrate can be rotated (about the substrate axis) continuously or in discrete steps. For example, a substrate may be rotated throughout the entire process, or the substrate can be rotated by a small amount between exposures to different reactive or purge gases. Rotating the substrate during processing (either continuously or in steps) may help produce a more uniform deposition or etch by minimizing the effect of, for example, local variability in gas flow geometries.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" may encompass both an orientation of above and below. The device may be otherwise oriented (rotated 90 degrees or at other orientations) and the spatially relative descriptors used herein interpreted accordingly.

The use of the terms "a" and "an" and "the" and similar referents in the context of describing the materials and methods discussed herein (especially in the context of the following claims) are to be construed to cover both the singular and the plural, unless otherwise indicated herein or clearly contradicted by context. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the materials and methods and does not pose a limitation on the scope unless otherwise claimed. No language in the specification should be construed as indicating any non-claimed element as essential to the practice of the disclosed materials and methods.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. In one or more embodiments, the particular features, structures, materials, or characteristics are combined in any suitable manner.

Although the disclosure herein has been described with reference to particular embodiments, it is to be understood that these embodiments are merely illustrative of the principles and applications of the present disclosure. It will be apparent to those skilled in the art that various modifications and variations can be made to the method and apparatus of the present disclosure without departing from the spirit and scope of the disclosure. Thus, it is intended that the present disclosure include modifications and variations that are within the scope of the appended claims and their equivalents.

What is claimed is:

1. A method of forming a stack, the method comprising:
    forming an encapsulation layer on the stack on a substrate, the substrate having at least one feature, the encapsulation layer comprising one or more of silicon nitride (SiN) or silicon carbonitride (SiCN); and
    oxidizing the encapsulation layer to form a dielectric layer having a dielectric constant in a range of from 4.0 to less than 7.0,
    wherein the substrate comprises one or more of a chalcogen, carbon, and a metal and the stack comprises at least one material that is sensitive to air or moisture, and each of the stack and the substrate is substantially undamaged.

2. The method of claim 1, wherein forming the encapsulation layer and oxidizing the encapsulation layer are performed in a processing system without breaking vacuum.

3. The method of claim 1, wherein the substrate comprises one or more of selenium (Se), tellurium (Te), sulfur (S), antimony (Sb), arsenic (As), indium (In), germanium (Ge), tungsten (W), carbon (C), nitrogen (N), and silicon (Si).

4. The method of claim 1, wherein the at least one feature has an aspect ratio greater than or equal to 1:1.

5. The method of claim 1, wherein forming the encapsulation layer comprises exposing the substrate to a silicon precursor and a nitrogen precursor and, optionally, a plasma.

6. The method of claim 5, wherein the silicon precursor is selected from one or more of diiodosilane (DIS), dichlorosilane (DCS), silicon tetrabromide, silicon tetraiodide, iodine containing precursors, halogen-free silicon precursors, pseudo halogen silicon precursors, sulfur-containing silicon precursors, amino silane precursors, silane precursors, and derivatives thereof.

7. The method of claim 5, wherein the nitrogen precursor is selected from one or more of nitrogen gas ($N_2$), ammonia ($NH_3$), hydrazine ($N_2H_4$), amines, $NR_xH_y$ where R contains carbon, $H_2N$—R—$NH_2$ where R contains carbon, and derivatives thereof.

8. The method of claim 5, wherein the plasma comprises one or more of nitrogen ($N_2$), hydrogen ($H_2$), ammonia ($NH_3$), helium (He), and argon (Ar).

9. The method of claim 1, wherein oxidizing the encapsulation layer comprises exposing the encapsulation layer to one or more of an oxygen-containing plasma and an oxidizing reagent.

10. The method of claim 9, wherein the oxygen-containing plasma is selected from one or more of oxygen ($O_2$) plasma, oxygen/argon ($O_2$/Ar) plasma, oxygen/helium ($O_2$/He) plasma, carbon dioxide ($CO_2$) plasma, carbon monoxide (CO) plasma, and nitrous oxide ($N_2O$) plasma.

11. The method of claim 9, wherein the oxidizing reagent is selected from one or more of oxygen ($O_2$), water ($H_2O$), hydrogen peroxide ($H_2O_2$), ozone ($O_3$), and nitrous oxide ($N_2O$).

12. The method of claim 1, wherein the dielectric layer comprises one or more of silicon oxynitride ($SiO_xN_y$) and silicon carbooxynitride ($SiC_xO_yN_z$).

13. The method of claim 1, further comprising repeating the method until the encapsulation layer has a thickness of greater than or equal to 10 Å.

14. The method of claim 1, wherein the stack is a phase change random-access memory (PCRAM) stack.

15. A method of forming a stack, the method comprising:
    sequentially exposing the stack on a substrate to a silicon precursor and a nitrogen precursor, and optionally a plasma, to form an encapsulation layer on the stack, the encapsulation layer comprising one or more of silicon nitride and silicon carbonitride, and the substrate having at least one feature with an aspect ratio greater than or equal to 1:1; and exposing the encapsulation layer to one or more of an oxygen-containing plasma and an oxidizing reagent to form a dielectric layer comprising one or more of silicon oxynitride ($SiO_xN_y$) and silicon carbooxynitride ($SiC_xO_yN_z$), the dielectric layer having a dielectric constant in a range of from 4.0 to less than 7.0, wherein the substrate comprises one or more of a chalcogen, carbon, and a metal and the stack comprises at least one material that is sensitive to air or moisture.

16. The method of claim 15, wherein forming the encapsulation layer and oxidizing the encapsulation layer are performed in a processing system without breaking vacuum.

17. The method of claim 15, wherein the substrate comprises one or more of selenium (Se), tellurium (Te), sulfur (S), antimony (Sb), arsenic (As), indium (In), germanium (Ge), tungsten (W), carbon (C), nitrogen (N), and silicon (Si).

18. The method of claim 15, wherein the silicon precursor is selected from one or more of diiodosilane (DIS), dichlorosilane (DCS), silicon tetrabromide, silicon tetraiodide, iodine containing precursors, halogen-free silicon precursors, pseudo halogen silicon precursors, sulfur-containing silicon precursors, amino silane precursors, silane precursors, and derivatives thereof, wherein the nitrogen precursor is selected from one or more of nitrogen gas ($N_2$), ammonia ($NH_3$), hydrazine ($N_2H_4$), amines, $NR_xH_y$ where R contains a carbon, $H_2N$—R—$NH_2$ where R contains carbon, and derivatives thereof, and wherein the plasma comprises one or more of nitrogen ($N_2$), hydrogen ($H_2$), ammonia ($NH_3$), helium (He), and argon (Ar).

19. The method of claim 15, further comprising purging the substrate of the silicon precursor and the nitrogen precursor prior to exposing the encapsulation layer to one or more of the oxygen-containing plasma and the oxidizing reagent.

20. The method of claim 15, further comprising repeating the method until the encapsulation layer has a thickness of greater than or equal to 10 Å.

* * * * *